(12) United States Patent
McGuinness et al.

(10) Patent No.: US 12,720,681 B2
(45) Date of Patent: Aug. 25, 2026

(54) SENSE RESISTOR

(71) Applicant: Analog Devices International Unlimited Company, Limerick (IE)

(72) Inventors: Patrick Martin McGuinness, Pallaskenry (IE); Joshua William Caldwell, Los Gatos, CA (US)

(73) Assignee: Analog Devices International Unlimited Company, County Limerick (IE)

( * ) Notice: Subject to any disclaimer, the term of this patent is extended or adjusted under 35 U.S.C. 154(b) by 589 days.

(21) Appl. No.: 18/060,472

(22) Filed: Nov. 30, 2022

(65) Prior Publication Data

US 2023/0180390 A1 Jun. 8, 2023

Related U.S. Application Data

(60) Provisional application No. 63/265,252, filed on Dec. 10, 2021, provisional application No. 63/264,915, filed on Dec. 3, 2021.

(51) Int. Cl.
*H05K 1/181* (2026.01)
*G01R 1/20* (2006.01)
(Continued)

(52) U.S. Cl.
CPC ............. *H05K 1/181* (2013.01); *G01R 1/203* (2013.01); *H10D 1/47* (2025.01); *H10D 84/209* (2025.01);
(Continued)

(58) Field of Classification Search
CPC ........ H05K 1/181; H10D 84/209; H01D 1/47; G01R 1/203; H01L 25/16
See application file for complete search history.

(56) References Cited

U.S. PATENT DOCUMENTS 5,729,438 A * 3/1998 Pieper .................... H05K 1/181
361/767
6,489,881 B1 * 12/2002 Aleksandravicius ........................ H10D 84/209
257/E27.047

(Continued)

FOREIGN PATENT DOCUMENTS

| | | | |
|---|---|---|---|
| CN | 1774771 | A | 5/2006 |
| CN | 105874338 | A | 8/2016 |
| CN | 111276305 | A | 6/2020 |

OTHER PUBLICATIONS

Anonymous: "Thin Film Multi-Tap Chip Resistor (.030×.030)", Jun. 10, 2014 (Jun. 10, 2014, pp. 1-2, XP0093137081, retrieved from the Internet: URL:https://www.spectrumcontrol.com/globalassets/documents/products/rf-microwave-microelectronics-power-solutions/microelectronics/thin-film-chip-resistors/thin-film-multi-tap-chip-resistors-030x030.pdf [retrieved on Mar. 2, 2024].

(Continued)

*Primary Examiner* — Kyung S Lee
(74) *Attorney, Agent, or Firm* — Knobbe, Martens, Olson & Bear, LLP

(57) ABSTRACT

Systems and methods for sense resistors are disclosed. In one aspect, an integrated sense resistor includes a plurality of first metal bumps alternating with a plurality of second metal bumps in at least a first lateral direction and a plurality of thin film resistors each disposed between and electrically connected to a pair of adjacent ones of first and second metal bumps. The integrated sense resistor can be configured for sensing a voltage developed by current flowing across the integrated sense resistor for determining a value of the current.

17 Claims, 11 Drawing Sheets

(51) Int. Cl.
*H10D 1/47* (2025.01)
*H10D 84/00* (2025.01)
*H10W 90/00* (2026.01)

(52) U.S. Cl.
CPC .. *H10W 90/00* (2026.01); *H05K 2201/10022* (2013.01); *H05K 2201/10151* (2013.01); *H05K 2201/10734* (2013.01)

(56) References Cited

U.S. PATENT DOCUMENTS 7,573,115 B2 * 8/2009 Melville ................. H01L 24/05 257/459
8,531,004 B1 * 9/2013 Jackson ................. H10D 84/00 257/E27.047
11,519,957 B2 * 12/2022 Berge ................. G01R 31/2896
2008/0231413 A1 9/2008 Bertin et al.
2012/0049324 A1 * 3/2012 Le Neel .............. H01L 23/5228 438/384
2012/0112737 A1 5/2012 Nakayama et al.
2013/0320497 A1 12/2013 Zhang et al.
2013/0334662 A1 * 12/2013 Jackson .................. H01L 24/17 257/536
2016/0084887 A1 * 3/2016 Beer ...................... G01R 1/203 324/126
2017/0317013 A1 11/2017 Yue et al.
2021/0096168 A1 4/2021 Berge et al.

OTHER PUBLICATIONS

European Examination Report for European Patent Application No. 22210483.8, dated Mar. 7, 2024 (6 pages).
First Office Action received in Chinese Application No. 202211540348.0, dated Sep. 24, 2025.
Extended European Search Report in application No. EP 22210483.8, dated May 9, 2023.

* cited by examiner 612
606
614
604
602

610
606
608
700

SENSE RESISTOR

CROSS-REFERENCE TO RELATED APPLICATION(S)

Any and all applications for which a foreign or domestic priority claim is identified in the Application Data Sheet as filed with the present application are hereby incorporated by reference under 37 CFR 1.57.

This application claims the benefit of priority of U.S. Provisional Application Nos. 63/264,915, filed Dec. 3, 2021, and U.S. Provisional Application No. 63/265,252, filed Dec. 10, 2021, the entire disclosures of which are incorporated herein by reference in their entireties.

BACKGROUND

Field

Embodiments of the invention relate to electronic systems, and more particularly to, systems and methods for integrating sense resistors into circuit boards.

Description of the Related Technology

Current sensing resistors, also referred to as sense resistors, are typically discrete resistors soldered on to customer circuit boards. However, such resistors may not be well suited for meeting the performance goals of upcoming sensing resistor designs, such as low impedance. Thus, there is a desire to improve the performance of sensing resistors.

SUMMARY OF THE DISCLOSURE

The methods and devices of the described technology each have several aspects, no single one of which is solely responsible for its desirable attributes.

In one aspect, there is provided an integrated sense resistor, comprising: a plurality of first metal bumps alternating with a plurality of second metal bumps in at least a first lateral direction; and a plurality of thin film resistors each disposed between and electrically connected to a pair of adjacent ones of first and second metal bumps, wherein the integrated sense resistor is configured for sensing a voltage developed by current flowing across the integrated sense resistor for determining a value of the current.

In another aspect, there is provided a system-in-package (SiP), comprising: a board substrate; and an integrated sense resistor comprising: a plurality of first metal pads or bumps alternating with a plurality of second metal pads or bumps in at least a first lateral direction, and a plurality of thin film resistors each disposed between and electrically connected to a pair of adjacent ones of first and second metal pads or bumps, wherein the first metal pads or bumps are electrically connected to each other through the board substrate, and wherein the second metal contact pads or bumps are electrically connected to each other through the board substrate.

In yet another aspect, there is provided an integrated sense resistor, comprising: a plurality of first metal pads alternating with a plurality of second metal pads in at least a first lateral direction; and a plurality of thin film resistors each disposed between and electrically connected to a pair of adjacent ones of first and second metal pads, wherein the first metal pads are electrically disconnected from each other, and wherein the second metal pads are electrically disconnected from each other.

BRIEF DESCRIPTION OF THE DRAWINGS

These drawings and the associated description herein are provided to illustrate specific embodiments of the invention and are not intended to be limiting.

DETAILED DESCRIPTION

Figure 1:
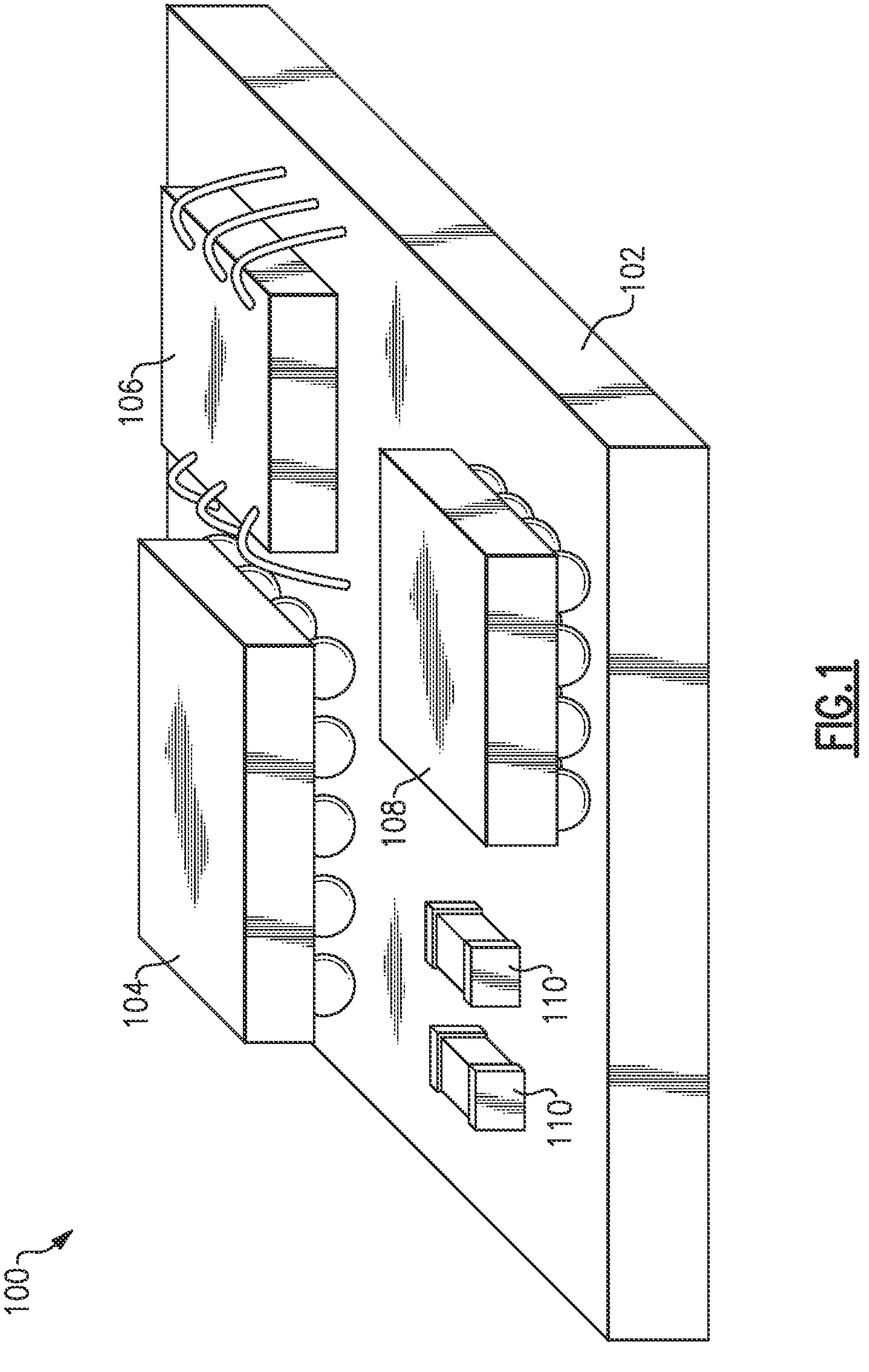
FIG. 1 illustrates an example of a sense resistor integrated into a partially assembled module that includes a sense resistor in accordance with aspects of this disclosure.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Overview of Current Sensing Resistors

Current sensing resistors, also referred to as sense resistors, are typically discrete resistors soldered on to customer circuit boards. Some sense resistors are integrated with other integrated circuit components, and area footprint can be limited. As such, there is a need for the ability to manufacture very compact sense resistors at relatively low cost.

Some traditional integrated resistor architectures may not be well suited for meeting the performance goals of sense resistors, including low impedance. This may be due to the fact that integrated precision resistors typically use resistive films that have a high sheet resistance. In addition, metal interconnect can also have relatively high impedance. In addition, absolute resistance error, temperature drift and limited heat dissipation can also make integrating sense resistors very difficult.

To address these and other needs, an integrated sense resistor is disclosed herein.

Figure 2:
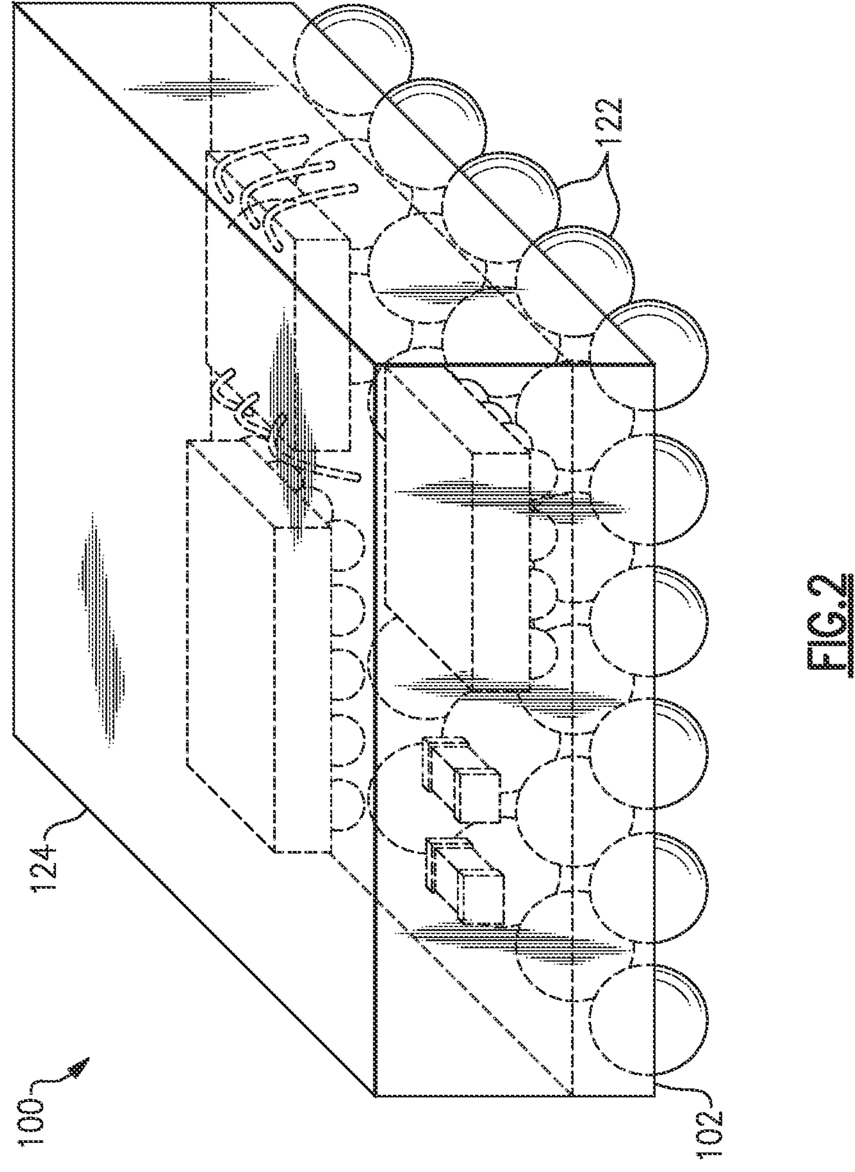
FIG. 2 illustrates the module of FIG. 1 including bumping and encapsulated in a molding.

FIG. 1 illustrates an example of a sense resistor integrated into a partially assembled module that includes a sense resistor in accordance with aspects of this disclosure. With reference to FIG. 1, the module 100 includes a printed circuit board (PCB) 102, a first integrated circuit 104, a second integrated circuit 106, a sense resistor 108, and one or more discrete components 110. In some embodiments, the sense resistor 108 can be embodied as a third integrated circuit. In addition, the one or more discrete components 110 can include passive components such as capacitors. Depending on the implementation, the printed circuit board 102 can be embodied as a laminate printed circuit board. FIG. 2 illustrates the module 100 of FIG. 1 including bumping 122 and encapsulated in a molding 124. The module 100 can represent a system-in-package (SiP).

There are a number of considerations and/or attributes for designing modules that integrate sense resistors. One consideration is to reduce or minimize the resistance of the sense resistor to reduce the voltage drop for relatively high current signals. This can present a challenge with some existing technologies such as precision thin film resistors, which that can have relatively high sheet resistances.

Another consideration is to reduce or minimize parasitic resistances in order to reduce headroom loss. This can be challenging when the interconnect metal layers fabricated using integrated interconnect metallization processes are less than about 1 μm in thickness.

Yet another consideration is the precision of absolute resistance since an error in the measured current may be proportional to the error in resistance. The fabrication tolerances may be wider than the acceptable error margins for current sense, which may lead to an unacceptably large measurement error.

One desirable attribute for sense resistors is to provide stability with temperature since temperature drift can cause errors in measure current. Thin films may be relatively temperature stable, but further improvements in temperature stability are desirable.

Another desirable attribute is good power handling which enables higher measurement currents. When thin film resistors are formed in an oxide stack, the resulting thermal insulation may increase the temperature of the thin film resistors in operation. It can be desirable to reduce the amount of heating to enable the measurement of higher currents.

Another consideration is the size of the sense resistor since the space available on modules may be limited. The space occupied by a sense resistor may be related to the sense resistor's power handling capabilities, and thus, higher power handling capabilities are desirable to enable smaller sized sense resistors.

Still another consideration is the cost of manufacturing sense resistors, which can be compounded for modules that integrate a plurality of sense resistors. Since integrated circuit manufacturing is typically more complex than discrete manufacturing, cost can be an important factor in manufacturing sense resistors.

According to one aspect of this disclosure, an integrated sense resistor comprises a plurality of first metal bumps alternating with a plurality of second metal bumps in at least a first lateral direction. The metal bumps can include any suitable solder metal bumps including lead-based and lead-free solder bumps, and can include metal elements such as lead (Pb), tin (Sn), silver (Ag), bismuth (Bi), antimony (Sb), indium (In), and cadmium (Cd). The sense resistor additionally comprises a plurality of thin film resistors each disposed between and electrically connected to a pair of adjacent ones of first and second metal bumps. The integrated sense resistor is configured for sensing a voltage developed by current flowing across the integrated sense resistor for determining a value of the current. For example, the resistance of the sense resistor (Rsense) may be predetermined, and by measuring a voltage on the sense lines resulting from an unknown current flowing therethrough, the unknown current can be calculated based the relationship I=(Vmeasured)/(Rsense).

In some embodiments, as fabricated, the first metal bumps are electrically disconnected from each other, and the second metal bumps are electrically disconnected from each other. In these embodiments, the integrated sense resistor may be formed over a board substrate, such that the first and second metal bumps are electrically connected to each other through the board substrate, and the second metal bumps are electrically connected to each other through the board substrate.

Figure 3:
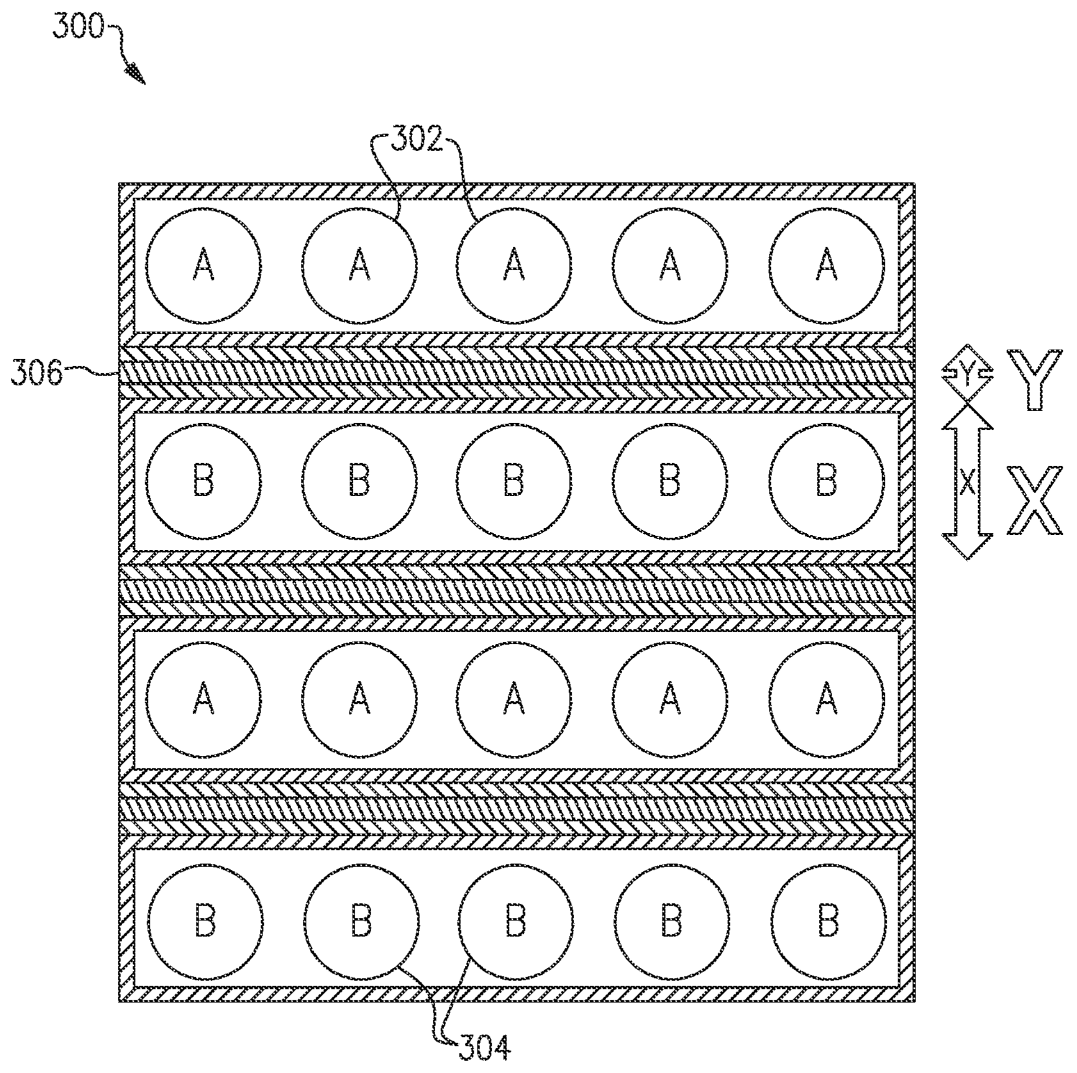
FIG. 3 illustrates an integrated resistor having first and second metal bumps alternating in a vertical direction.
Figure 4:
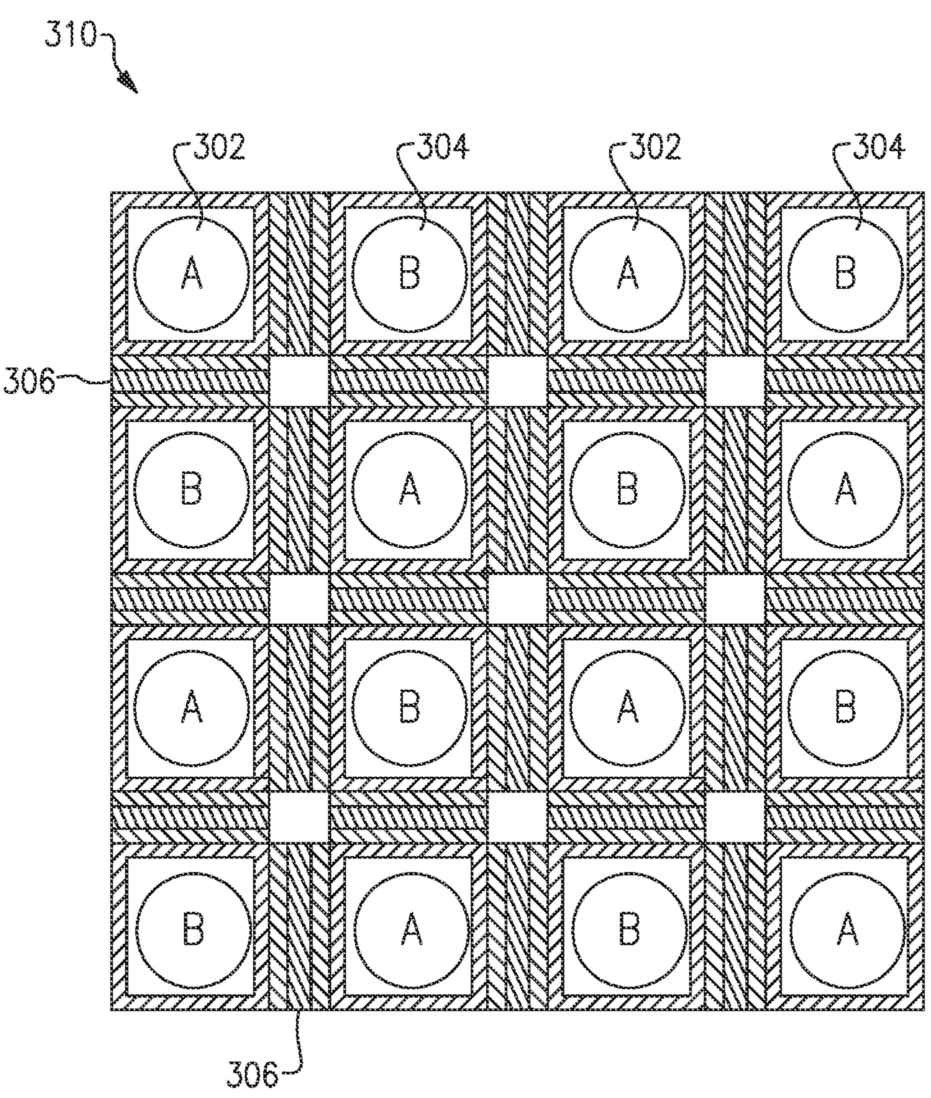
FIG. 4 illustrates an integrated resistor having first and second metal bumps alternating in vertical and horizontal directions.

FIGS. 3 and 4 show example configurations of the integrated resistor in accordance with aspects of this disclosure. In particular, FIG. 3 illustrates an integrated resistor having first and second metal bumps alternating in a vertical direction. FIG. 4 illustrates an integrated resistor having first and second metal bumps alternating in vertical and horizontal directions.

With reference to FIG. 3, the integrated sense resistor 300 includes a plurality of first bumps 302 (also labeled "A"), a plurality of second bumps 304 (also labeled "B"), and a plurality of thin film resistors 306. The first and second bumps 302 and 304 may also be referred to as first and second metal pads 302 and 304. The first bumps 302 and the second bumps 304 are arranged in rows having a width of "X" and the thin film resistors 306 have a width of "Y". Since the thin film resistors are interposed between adjacent rows, each of the rows is separated by the distance "Y". Thus, the rows of first and second bumps 302 and 304 may extend in a first lateral direction and the rows may alternate in a second lateral direction orthogonal to the first lateral direction.

With reference to FIG. 4, the integrated sense resistor 310 also includes a plurality of first bumps 302 (also labeled "A") and a plurality of second bumps 304 (also labeled "B"). In this embodiment, the first bumps 302 and the second bumps 304 are arranged in rows having a width of "X", where each of the rows is separated by a distance "Y". Unlike the integrated sense resistor 300 described with respect to FIG. 3, in the embodiment illustrated in FIG. 4, the first metal bumps 302 and the second metal bumps 304 alternate in each of the first and second lateral directions such that the first and second metal bumps 302 and 304 are arranged in a checkerboard or waffle pattern.

In some embodiments, the first and second metal bumps 302 and 304 form an array comprising rows extending in the first lateral direction and columns extending in the second lateral direction, where each of the rows and columns comprise the first metal bumps 302 alternating with the second metal bumps 304.

In some embodiments, adjacent rows are interposed by a row of thin film resistors 306 aligned in the first lateral direction (e.g., horizontal in FIG. 4), and adjacent columns are interposed by a column of thin film resistors 306 aligned in the second lateral direction (e.g., vertical in FIG. 4).

As shown in FIGS. 3 and 4, each of the thin film resistors 306 has a rectangular footprint defined by a first lateral dimension, e.g., a length having the distance Y, and a second lateral dimension greater than the first lateral dimension, e.g., a width having the distance X, wherein the second lateral dimension corresponds to a length of the thin film resistor through which current flows. As arranged in at least the waffle design of FIG. 4, the area footprint of the integrated sense resistor can be substantially reduced. For example, for illustrative purposes only, when the thin film resistors 306 of the integrated sense resistor 300 illustrated in FIG. 3 and the thin film resistors 306 of the integrated sense resistor 310 illustrated in FIG. 4 have the same width and length, and the integrated sense resistor 300 and the integrated sense resistor 310 have the same overall footprint, the integrated sense resistor 300 integrates 16 thin film resistors 306, whereas the integrated sense resistor 310 integrates 25 thin film resistors 306. Thus, the waffle design illustrated in FIG. 4, having in which the first and second metal bumps 302, 304 alternate in both lateral directions, can provide further footprint reduction or higher resistor density per unit area, relative to the design illustrated in FIG. 3, in which the first and second metal bumps 302, 304 alternate in one but not the other of the lateral directions.

In some embodiments, the array of the first and second metal bumps 302 and 304 comprises the same number of thin film resistors 306 in which current flows from left to right in the first lateral direction relative to thin film resistors 306 in which current flows from right to left in the first lateral direction. In addition, the array of the first and second metal bumps 302 and 304 comprises the same number of thin film resistors 306 in which current flows from top to bottom in the second lateral direction relative to thin film resistors 306 in which current flows from bottom to top in the second lateral direction. Due to this arrangement, the Seebeck effect that may be generated by temperature gradient across the integrated sense resistor may be substantially cancelled out.

Figure 5A:
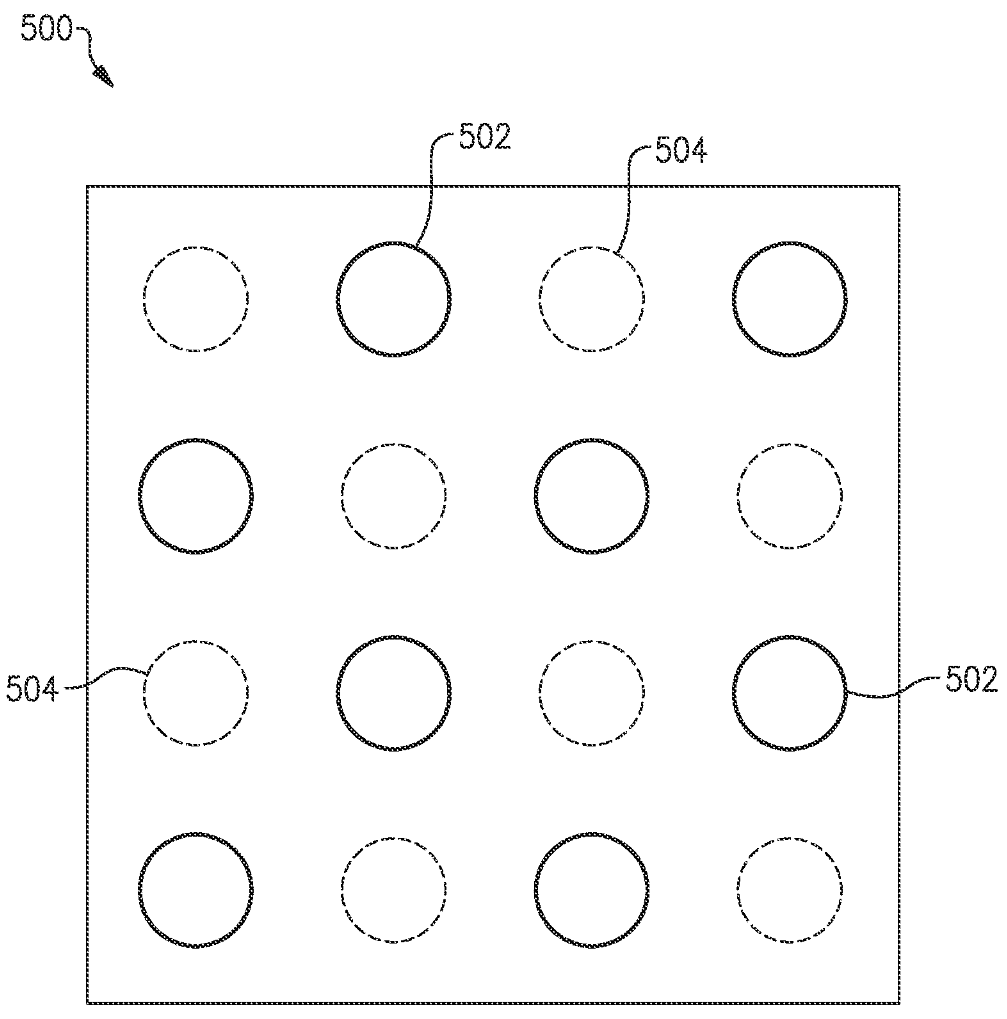
FIGS. 5A and 5B illustrate example vertical metal levels in accordance with aspects of this disclosure.
Figure 5B:
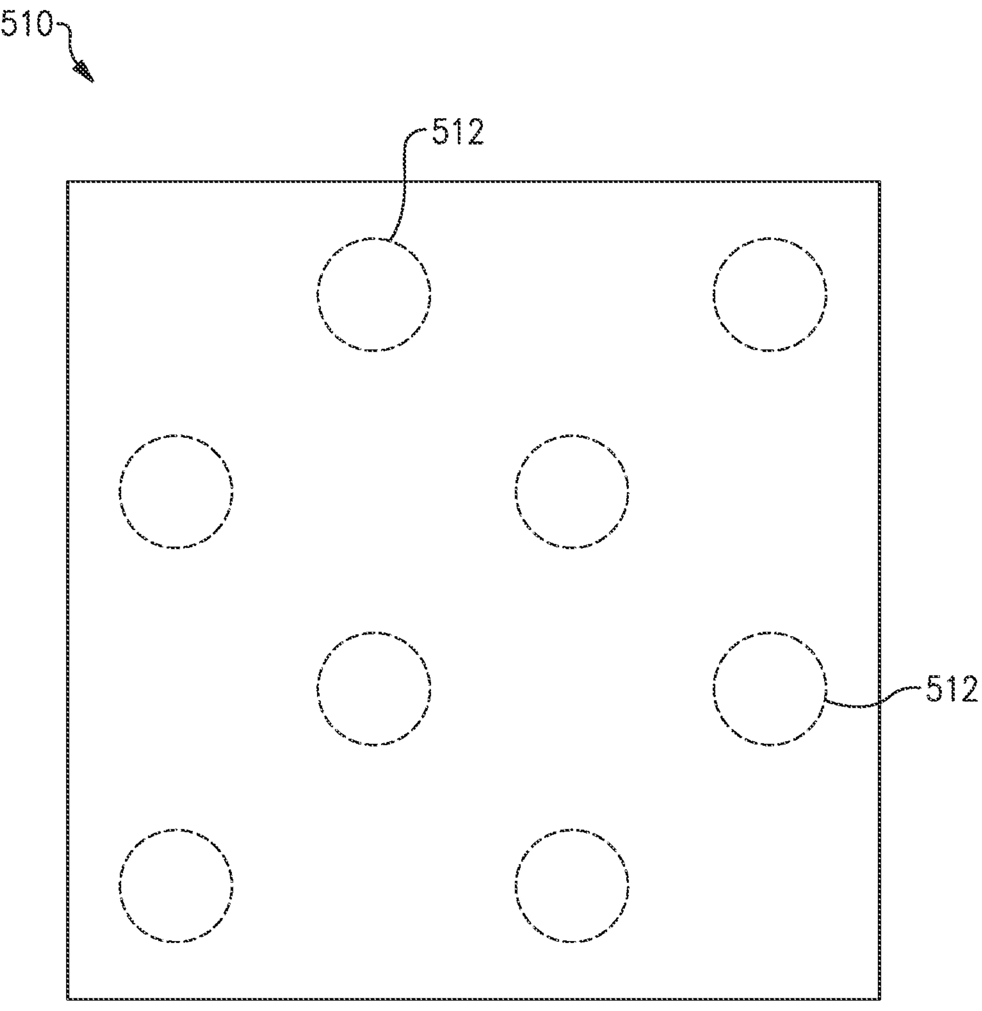

FIGS. 5A and 5B illustrate example vertical metal levels in accordance with aspects of this disclosure. In particular, FIG. 5A illustrates a first vertical metal level 500 (also referred to as a first board substrate) comprising openings 502 configured to allow the first metal bumps 302 to pass through the first vertical metal level 500 and areas 504 (e.g., pads) configured to electrically connect to the second metal bumps 304. FIG. 5B illustrates a second vertical metal level 510 (also referred to as a second board substrate) comprising areas 512 (e.g., pads) configured to electrically connect to the first metal bumps 302.

In some embodiments, the first metal bumps 302 are electrically connected to each other at the second vertical metal level 510 and the second metal bumps are electrically connected to each other at the first vertical metal level 500 different from the second vertical metal level 510. In some implementations, the vertical metal levels 500 and 510 can be embodied as laminate layers receiving metal layers and/or metal sheets.

Figure 6A:
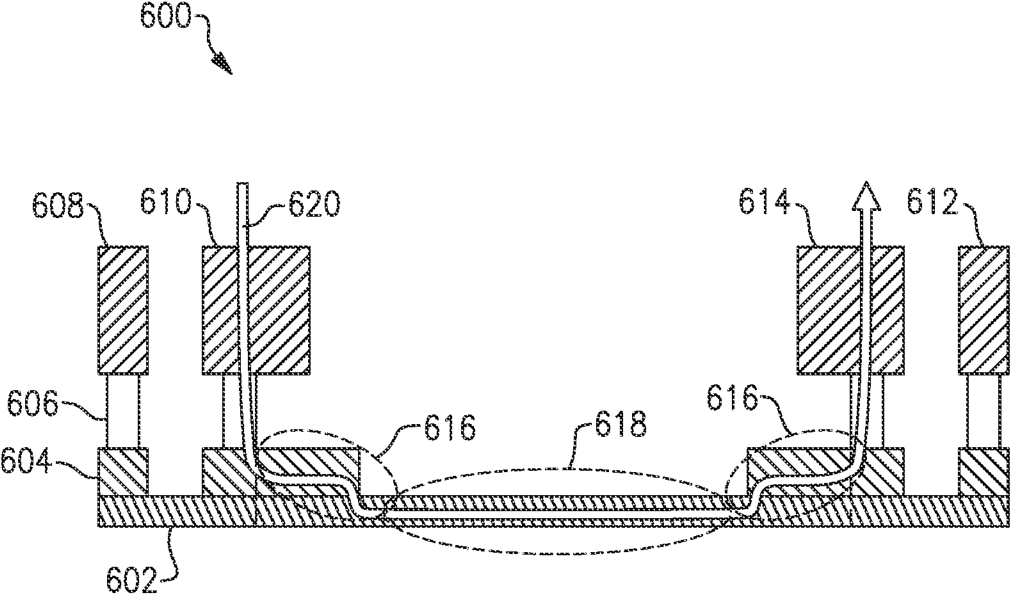
FIGS. 6A and 6B illustrate an embodiment of a thin film resistor in accordance with aspects of this disclosure.
Figure 6B:
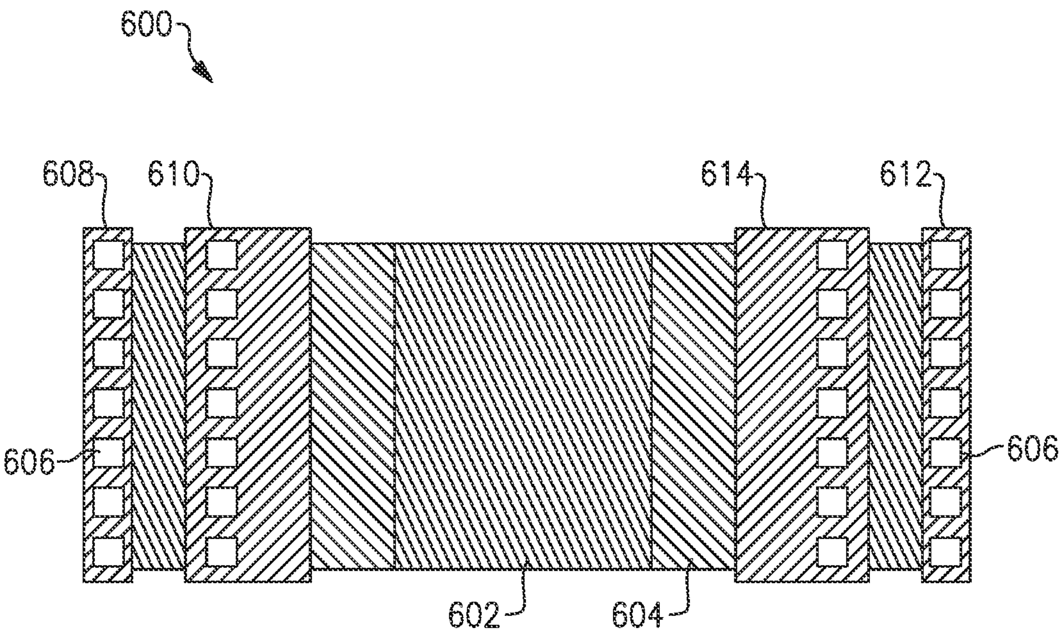

FIGS. 6A and 6B illustrate an embodiment of a thin film resistor in accordance with aspects of this disclosure. In particular, FIG. 6A illustrates a cross section of the thin film resistor 600 in operation, in accordance with aspects of this disclosure. FIG. 6B illustrates a top down view of the thin film resistor 600 in accordance with aspects of this disclosure.

With reference to FIGS. 6A and 6B, the thin film resistor 600 comprises a first layer 602, a second layer 604, a plurality of vias 606, and a plurality of metal interconnects (also referred to as sense lines) including an $A_{Sense}$ interconnect 608, an $A_{Force}$ interconnect 610, a $B_{Sense}$ interconnect 612, and a $B_{Force}$ interconnect 614. In some embodiments, the first layer 602 is formed of silicon chromium (SiCr) and the second layer 604 is formed of tungsten-titanium (TiW).

The thin film resistor 600 can also include two different regions including a first region 616 having positive coefficient of resistance (TCR) and a second region 618 having a negative TCR that are arranged, e.g., serially, such that a net TCR has a smaller magnitude than a magnitude of the TCR of each of the first and second regions 616 and 618. In some embodiments, the overall TCR of the first and second regions 616 and 618 together may be substantially zero. For example, without limitation, the first region 616 can be formed of a thin film of TiW having a positive TCR, and the second region 618 can be formed of a thin film of SiCr having a negative TCR, such that the overall TCR is substantially reduced in magnitude relative to the TCRs of each of the first and second regions 616, 618. The sense lines 608-614 can be electrically coupled to the thin film resistor 600 at the resistor level (e.g., at the level of the first and second layers 602 and 604 by the vias 606. In addition, the sense lines 608-614 and vias 606 can be formed outside of a sensing loop defined by the first and second regions 616 and 618. In one example, current 620 can flow through the thin film resistor from the $A_{Force}$ interconnect 610, through the first and second regions 616 and 618 and out of the $B_{Force}$ interconnect 614.

Figure 7:
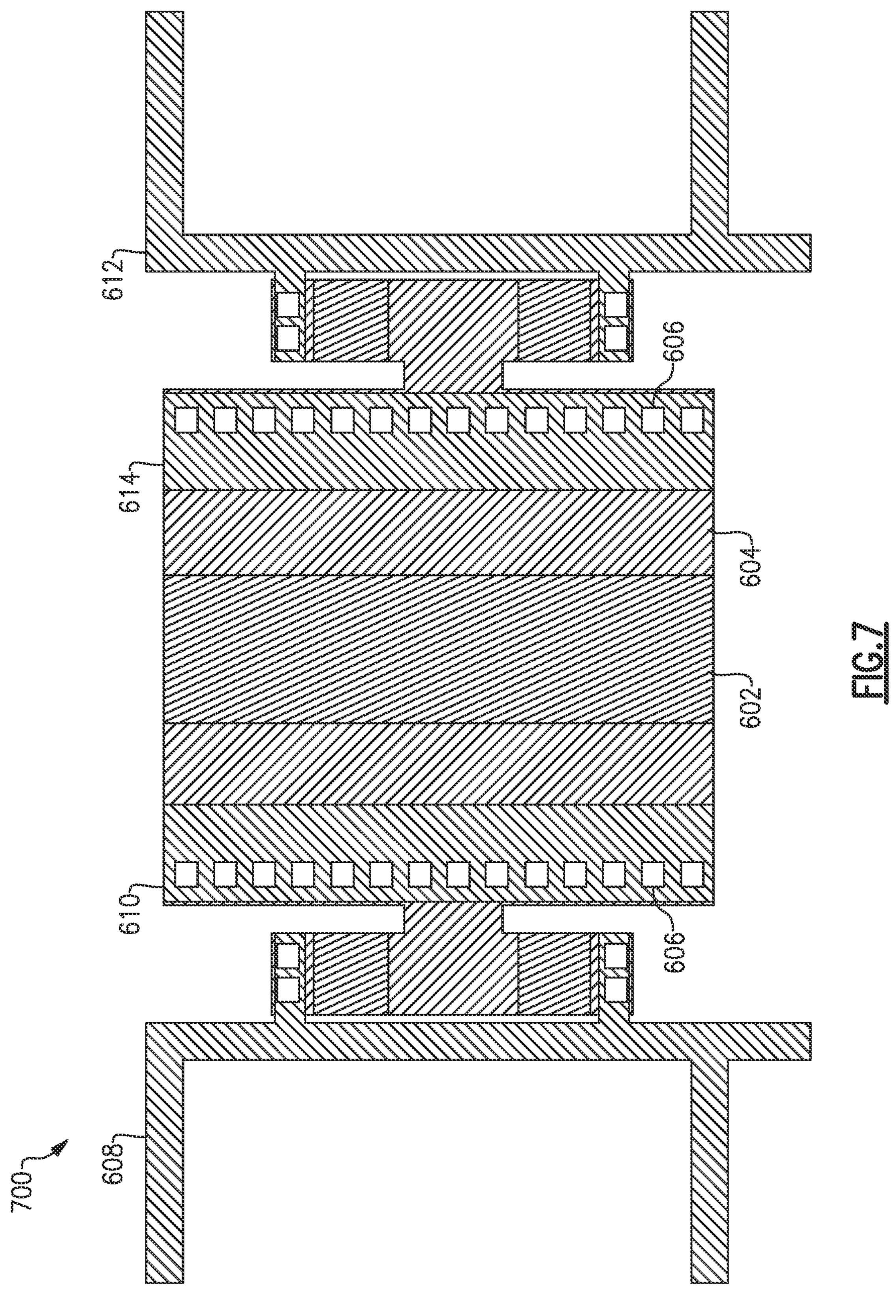
FIG. 7 illustrates another embodiment of a thin film resistor constructed for a waffle design sense resistor in accordance with aspects of this disclosure.

FIG. 7 illustrates another embodiment of a thin film resistor 700 constructed for a waffle design sense resistor 310 (FIG. 4) in accordance with aspects of this disclosure. In particular, the thin film resistor 700 of FIG. 7 may have substantially the same elements as the thin film resistor 600 of FIG. 6 with a layout that is configurable in a "waffle" design sense resistor, such as the sense resistor 310 of FIG. 4.

Figure 8A:
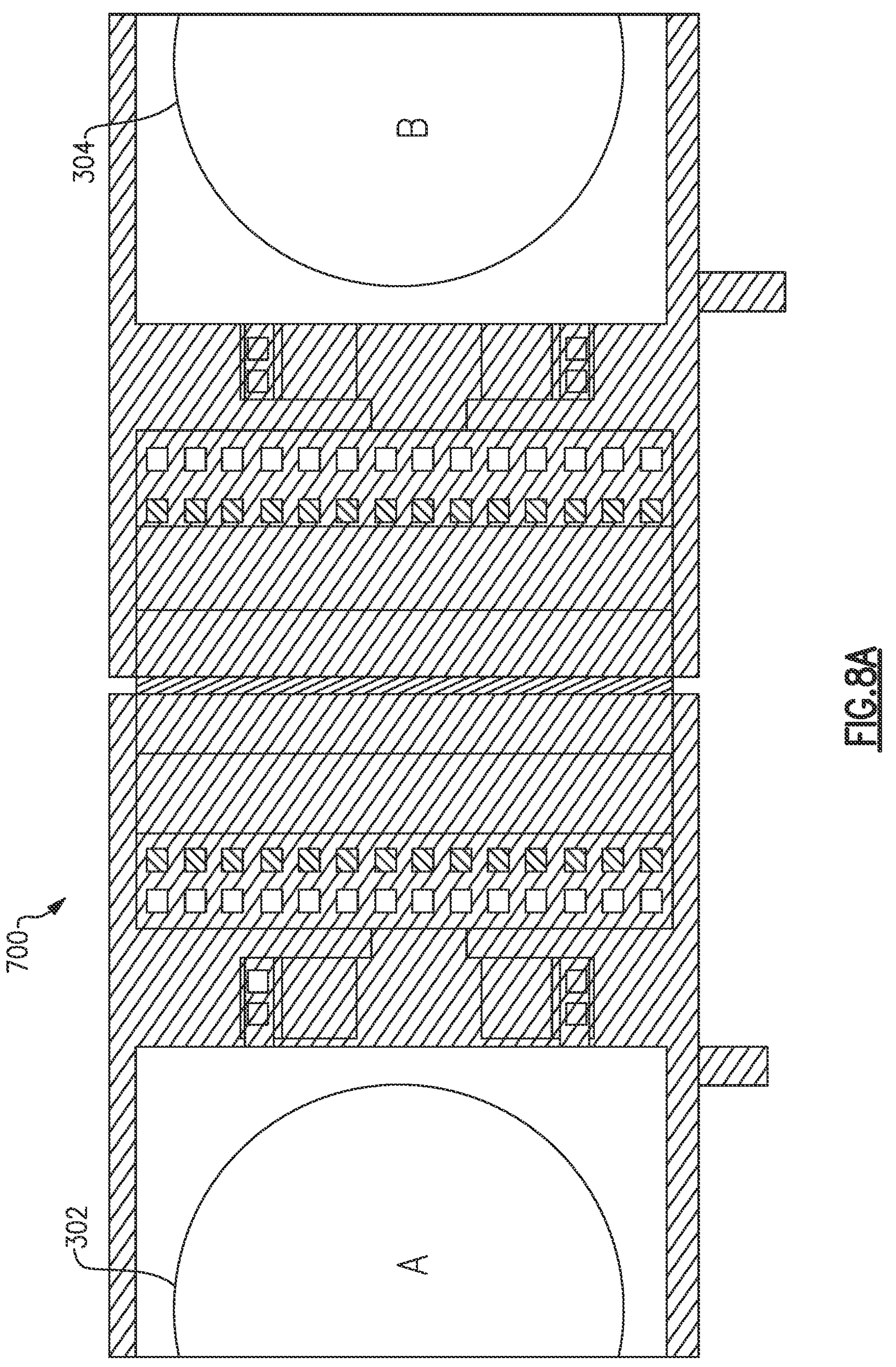
FIGS. 8A and 8B illustrate view of the thin film resistor at stages of integration into a sense resistor in accordance with aspects of this disclosure.
Figure 8B:
Figure 8B:
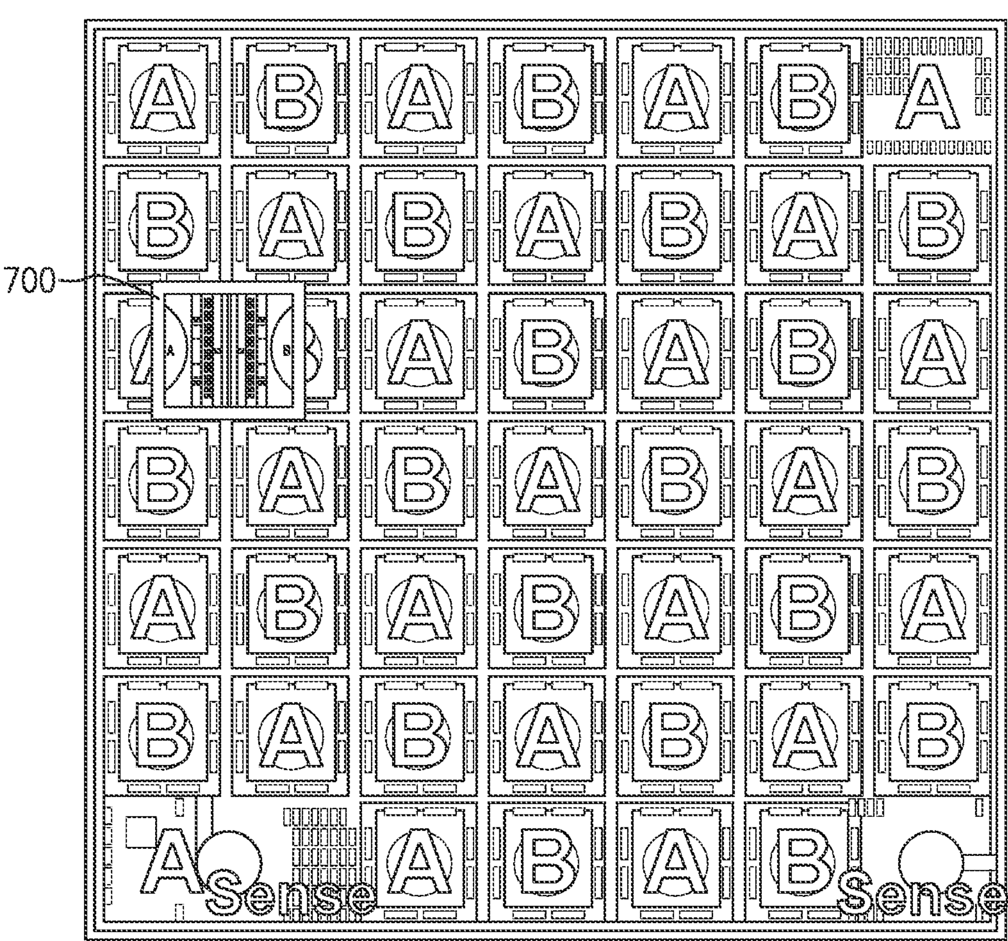

FIGS. 8A and 8B illustrate view of the thin film resistor 700 at stages of integration into a sense resistor 310 in accordance with aspects of this disclosure. Specifically, FIG. 8A illustrates the thin film resistor 700 arranged between a first bump 302 and a second bump 304 of an integrated sense resistor 310. With reference to FIGS. 7 and 8A, the first bump 302 can be connected to the $A_{Sense}$ interconnect 608 and the second bump 304 can be connected to the $B_{Sense}$ interconnect 612. FIG. 8B illustrates the location of a thin film resistor 700 within an example layout of an integrated sense resistor 310.

In various embodiments, the thin film resistors 600 are lithographically patterned on a semiconductor substrate.

In some embodiments, the integrated sense resistor is formed over a board substrate comprising a laminated polymeric substrate, e.g., a laminated PCB, and the substrate has formed thereon additional discrete integrated circuit components. One embodiment of such a PCB is the PCB 102 of FIG. 1.

In another aspect, a system-in-package (SiP) comprises a board substrate and an integrated sense resistor 310. The integrated sense resistor 310 comprises a plurality of first metal pads or bumps 302 alternating with a plurality of second metal pads or bumps 304 in at least a first lateral direction, and a plurality of thin film resistors 600 each disposed between and electrically connected to a pair of adjacent ones of first and second metal pads or bumps 302 and 304. The first metal pads or bumps 302 are electrically connected to each other through the board substrate, and wherein the second metal contact pads or bumps 304 are electrically connected to each other through the board substrate.

In another aspect, an integrated sense resistor 310 comprises a plurality of first metal pads 302 alternating with a plurality of second metal pads 304 in at least a first lateral direction. The integrated sense resistor 310 additionally comprises a plurality of thin film resistors 600 each disposed between and electrically connected to a pair of adjacent ones of first and second metal pads 302 and 304. As fabricated, the first metal pads 302 are electrically disconnected from each other, and the second metal pads 304 are electrically disconnected from each other.

As disclosed herein, the disclosed sense resistor is made area-efficient by using a "waffle" design, which can enable packing>60% more resistor width in a given die area, compared to standard striped resistors. The disclosed sense resistors leverages benefit from low resistance thick copper traces on a laminate substrate, where the thick copper traces become part of the resistor design and thus significantly reduces parasitic resistances. In addition, the integrated sense resistor can be configured to at least partially cancel out thermoelectric effects. Thu, even if there are temperature gradients across the sense resistor die, the voltages generated by the Seebeck effect can substantially be cancelled out by a corresponding Seebeck effect voltage in the opposite direction. With a combination of waffle design and the use of distributed bumps/pillars across the integrated sense resistor, heat dissipation can be optimized. Finally, sense off the back of the resistor using the resistor materials themselves can allow for a relatively straight forward method of canceling out both negative and positive TCRs so that the overall TCR can be maintained close to near zero ppm/' C.

Additional Embodiments

1. An integrated sense resistor, comprising:
   a plurality of first metal bumps alternating with a plurality of second metal bumps in at least a first lateral direction; and
   a plurality of thin film resistors each disposed between and electrically connected to a pair of adjacent ones of first and second metal bumps,
   wherein the integrated sense resistor is configured for sensing a voltage developed by current flowing across the integrated sense resistor for determining a value of the current.
2. The integrated sense resistor of Embodiment 1, wherein the first metal bumps are electrically disconnected from each other, and wherein the second metal bumps are electrically disconnected from each other.
3. The integrated sense resistor of Embodiment 1, wherein the integrated sense resistor is formed over a board substrate, wherein the first and second metal bumps are electrically connected to each other through the board substrate, and wherein the second metal bumps are electrically connected to each other through the board substrate.
4. The integrated sense resistor of Embodiment 1, wherein the first metal bumps and the second metal bumps further alternate in a second direction crossing the first lateral direction.
5. The integrated sense resistor of Embodiment 1, wherein the first metal bumps and the second metal bumps further alternate in a second lateral direction orthogonal to the first lateral direction such that the first and second metal bumps are arranged in a checkerboard pattern.
6. The integrated sense resistor of Embodiment 1, wherein the first metal bumps and the second metal bumps further alternate in a second lateral direction orthogonal to the first lateral direction such that the first and second metal bumps form an array comprising rows extending in the first lateral direction and columns extending in the second lateral direction, each of the rows and columns comprising the first metal bumps alternating with the second metal bumps.
7. The integrated sense resistor of Embodiment 5, wherein adjacent rows are interposed by a row of thin film resistors aligned in the first lateral direction, and wherein adjacent columns are interposed by a column of thin film resistors thin film resistors aligned in the second lateral direction.
8. The integrated sense resistor of any one of the above Embodiments, wherein the thin film resistors comprise the same number of thin film resistors in which current flows from left to right in the first lateral direction relative to thin film resistors in which current flows from right to left in the first lateral direction.
9. The integrated sense resistor of any one of the above Embodiments, wherein the thin film resistors are lithographically patterned on a semiconductor substrate.
10. The integrated sense resistor of any one of the above Embodiments, wherein the thin film resistors comprise a stack comprising a first layer having positive coefficient of resistance (TCR) and a second layer having a negative TCR such that a net TCR has a smaller magnitude than a magnitude of the TCR of each of the first and second layers.
11. The integrated sense resistor of any one of the above Embodiments, wherein each of the thin film resistors has a rectangular footprint defined by a first lateral dimension and a second lateral dimension greater than the first lateral dimension, wherein the second lateral dimension corresponds to a length of the thin film resistor through which current flows.
12. The integrated sense resistor of any one of the above Embodiments, wherein the first metal bumps are electrically connected to each other at a first vertical metal level and the second metal bumps are electrically connected to each other at a second vertical metal level different from the first vertical metal level.

13. The integrated sense resistor of Embodiment 12, wherein the first metal bumps are electrically connected to each other through a first metal sheet at the first vertical metal level and the second metal bumps are electrically connected to each other through a second metal sheet at the second vertical metal.

14. The integrated sense resistor of any one of the above Embodiments, wherein the integrated sense resistor is formed over a board substrate comprising a laminated polymeric substrate, the board substrate having formed thereon additional discrete integrated circuit components.

15. A system-in-package (SiP), comprising:
  a board substrate; and
  an integrated sense resistor comprising:
    a plurality of first metal pads or bumps alternating with a plurality of second metal pads or bumps in at least a first lateral direction, and
    a plurality of thin film resistors each disposed between and electrically connected to a pair of adjacent ones of first and second metal pads or bumps,
  wherein the first metal pads or bumps are electrically connected to each other through the board substrate, and wherein the second metal contact pads or bumps are electrically connected to each other through the board substrate.

16. The SiP of Embodiment 15, wherein the first metal pads or bumps and the second metal pads or bumps further alternate in a second direction crossing the first lateral direction.

17. The SiP of Embodiment 15, wherein the first metal pads or bumps and the second metal pads or bumps further alternate in a second lateral direction orthogonal to the first lateral direction such that the first and second metal pads or bumps are arranged in a checkerboard pattern.

18. The SiP of Embodiment 15, wherein the first metal pads or bumps and the second metal pads or bumps further alternate in a second lateral direction orthogonal to the first lateral direction such that the first and second metal pads or bumps form an array comprising rows extending in the first lateral direction and columns extending in the second lateral direction, each of the rows and columns comprising the first metal pads or bumps alternating with the second metal pads or bumps.

19. The SiP of Embodiment 18, wherein adjacent rows are interposed by a row of thin film resistors aligned in the first lateral direction, and wherein adjacent columns are interposed by a column of thin film resistors thin film resistors aligned in the second lateral direction.

20. The SiP of any one of Embodiments 15-19, wherein the thin film resistors comprise the same number of thin film resistors in which current flows from left to right in the first lateral direction relative to thin film resistors in which current flows from right to left in the first lateral direction.

21. The SiP of any one of Embodiments 15-20, wherein the thin film resistors are lithographically patterned on a semiconductor substrate.

22. The SiP of any one of Embodiments 15-21, wherein the thin film resistors comprise a stack comprising a first layer having positive coefficient of resistance (TCR) and a second layer having a negative TCR such that a net TCR has a smaller magnitude than a magnitude of the TCR of each of the first and second layers.

23. The SiP of any one of Embodiments 15-22, wherein each of the thin film resistors has a rectangular footprint defined by a first lateral dimension and a second lateral dimension greater than the first lateral dimension, wherein the second lateral dimension corresponds to a length of the thin film resistor through which current flows.

24. The SiP of any one of Embodiments 15-23, wherein the first metal pads or bumps are electrically connected to each other at a first vertical metal level and the second metal pads or bumps are electrically connected to each other at a second vertical metal level different from the first vertical metal level.

25. The SiP of Embodiment 24, wherein the first metal pads or bumps are electrically connected to each other through a first metal sheet at the first vertical metal level and the second metal pads or bumps are electrically connected to each other through a second metal sheet at the second vertical metal.

26. The SiP of any one of Embodiments 15-25, wherein the board substrate comprises a laminated polymeric substrate, and wherein the board substrate has formed thereon additional discrete integrated circuit components.

27. An integrated sense resistor, comprising:
  a plurality of first metal pads alternating with a plurality of second metal pads in at least a first lateral direction; and
  a plurality of thin film resistors each disposed between and electrically connected to a pair of adjacent ones of first and second metal pads,
  wherein the first metal pads are electrically disconnected from each other, and wherein the second metal pads are electrically disconnected from each other.

28. The integrated sense resistor of Embodiment 27, wherein the first metal pads are configured to be electrically connected to each other through a board substrate, and wherein the second metal contact pads are configured electrically connected to each other through the board substrate.

29. The integrated sense resistor of Embodiments 27 or 28, wherein the first metal pads and the second metal pads further alternate in a second direction crossing the first lateral direction.

30. The integrated sense resistor of Embodiments 27 or 28, wherein the first metal pads and the second metal pads further alternate in a second lateral direction orthogonal to the first lateral direction such that the first and second metal pads are arranged in a checkerboard pattern.

31. The integrated sense resistor of Embodiments 27 or 28, wherein the first metal pads and the second metal pads further alternate in a second lateral direction orthogonal to the first lateral direction such that the first and second metal pads form an array comprising rows extending in the first lateral direction and columns extending in the second lateral direction, each of the rows and columns comprising the first metal pads alternating with the second metal pads.

32. The integrated sense resistor of Embodiment 31, wherein adjacent rows are interposed by a row of thin film resistors aligned in the first lateral direction, and wherein adjacent columns are interposed by a column of thin film resistors thin film resistors aligned in the second lateral direction.

33. The integrated sense resistor of any one of Embodiments 27-32, wherein the thin film resistors comprise the same number of thin film resistors in which current flows from left to right in the first lateral direction relative to thin film resistors in which current flows from right to left in the first lateral direction.

34. The integrated sense resistor of any one of Embodiments 27-33, wherein the thin film resistors are lithographically patterned on a semiconductor substrate.

35. The integrated sense resistor of any one of Embodiments 27-34, wherein the thin film resistors comprise a stack comprising a first layer having positive coefficient of resistance (TCR) and a second layer having a negative TCR such that a net TCR has a smaller magnitude than a magnitude of the TCR of each of the first and second layers.

36. The integrated sense resistor of any one of Embodiments 27-35, wherein each of the thin film resistors has a rectangular footprint defined by a first lateral dimension and a second lateral dimension greater than the first lateral dimension, wherein the second lateral dimension corresponds to a length of the thin film resistor through which current flows.

37. The integrated sense resistor of any one of Embodiments 27-36, wherein the first metal pads are electrically connected to each other at a first vertical metal level and the second metal pads are electrically connected to each other at a second vertical metal level different from the first vertical metal level.

38. The integrated sense resistor of Embodiment 37, wherein the first metal pads are electrically connected to each other through a first metal sheet at the first vertical metal level and the second metal pads are electrically connected to each other through a second metal sheet at the second vertical metal.

CONCLUSION

In the foregoing, it will be appreciated that any feature of any one of the embodiments can be combined or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. An integrated sense resistor, comprising:

a plurality of first metal bumps alternating with a plurality of second metal bumps in a first lateral direction and further in a second lateral direction orthogonal to the first lateral direction, such that the plurality of first metal bumps and the plurality of second metal bumps are arranged in a checkerboard pattern; and a plurality of thin film resistors each disposed between and electrically connected to a pair of adjacent ones of the plurality of first metal bumps and the plurality of second metal bumps, wherein the integrated sense resistor is configured for sensing a voltage developed by current flowing across the integrated sense resistor for determining a value of the current.

2. The integrated sense resistor of claim 1, wherein the integrated sense resistor is formed over a board substrate, wherein the plurality of first metal bumps are electrically connected to each other through the board substrate, and wherein the plurality of second metal bumps are electrically connected to each other through the board substrate.

3. The integrated sense resistor of claim 1, wherein the plurality of first metal bumps and the plurality of second metal bumps form an array comprising rows extending in the first lateral direction and columns extending in the second lateral direction, each of the rows and columns comprising the plurality of first metal bumps alternating with the plurality of second metal bumps.

4. The integrated sense resistor of claim 3, wherein adjacent rows are interposed by a row of thin film resistors aligned in the first lateral direction, and wherein adjacent columns are interposed by a column of the plurality of thin film resistors aligned in the second lateral direction.

5. The integrated sense resistor of claim 1, wherein the plurality of thin film resistors are lithographically patterned on a semiconductor substrate.

6. The integrated sense resistor of claim 1, wherein the plurality of first metal bumps are electrically connected to each other at a first vertical metal level and the plurality of second metal bumps are electrically connected to each other at a second vertical metal level different from the first vertical metal level.

7. A system-in-package (SiP), comprising:

a board substrate; and an integrated sense resistor comprising:

a plurality of first metal pads or bumps alternating with a plurality of second metal pads or bumps in at least a first lateral direction, and a plurality of thin film resistors each disposed between and electrically connected to a pair of adjacent ones of the plurality of first metal pads or bumps and the plurality of second metal pads or bumps, wherein the plurality of first metal pads or bumps are electrically connected to each other through the board substrate, and wherein the plurality of second metal pads or bumps are electrically connected to each other through the board substrate.

8. The SiP of claim 7, wherein the plurality of first metal pads or bumps and the plurality of second metal pads or bumps further alternate in a second direction crossing the first lateral direction.

9. The SiP of claim 8, wherein the plurality of thin film resistors are lithographically patterned on a semiconductor substrate.

10. The SiP of claim 8, wherein the plurality of first metal pads or bumps are electrically connected to each other at a first vertical metal level and the plurality of second metal pads or bumps are electrically connected to each other at a second vertical metal level different from the first vertical metal level.

11. The SiP of claim 10, wherein the plurality of first metal pads or bumps are electrically connected to each other through a first metal sheet at the first vertical metal level and the plurality of second metal pads or bumps are electrically connected to each other through a second metal sheet at the second vertical metal level.

12. The SiP of claim 7, wherein the board substrate comprises a laminated polymeric substrate, and wherein the board substrate has formed thereon additional discrete integrated circuit components.

13. An integrated sense resistor, comprising:

a plurality of first metal pads alternating with a plurality of second metal pads in a first lateral direction and further in a second direction orthogonal to the first lateral direction, such that the plurality of first metal pads and the plurality of second metal pads are arranged in a checkerboard pattern; and a plurality of thin film resistors each disposed between and electrically connected to a pair of adjacent ones of the plurality of first metal pads and the plurality of second metal pads, wherein the plurality of first metal pads are electrically disconnected from each other, and wherein the plurality of second metal pads are electrically disconnected from each other.

14. The integrated sense resistor of claim 13, wherein the plurality of first metal pads are configured to be electrically connected to each other through a board substrate, and wherein the plurality of second metal pads are configured electrically connected to each other through the board substrate.

15. The integrated sense resistor of claim 14, wherein the plurality of first metal pads are configured to be electrically connected to each other at a first vertical metal level above the board substrate, and the plurality of second metal pads are configured to be electrically connected to each other at a second vertical metal level above the board substrate different from the first vertical metal level.

16. The integrated sense resistor of claim 13, wherein the plurality of thin film resistors comprise the same number of thin film resistors in which current flows from left to right in the first lateral direction relative to thin film resistors in which current flows from right to left in the first lateral direction.

17. The integrated sense resistor of claim 13, wherein the plurality of thin film resistors comprise a stack comprising a first layer having positive coefficient of resistance (TCR) and a second layer having a negative TCR such that a net TCR has a smaller magnitude than a magnitude of the TCR of each of the first layer and the second layer.

* * * * *